United States Patent [19]

Snyder et al.

[11] 4,367,509
[45] Jan. 4, 1983

[54] ANTI-LATCH CIRCUIT FOR POWER OUTPUT DEVICES USING INDUCTIVE LOADS

[75] Inventors: Donald J. Snyder; Fletcher A. Bozarth, both of Indianapolis, Ind.

[73] Assignee: RCA Corporation, New York, N.Y.

[21] Appl. No.: 255,285

[22] Filed: Apr. 17, 1981

Related U.S. Application Data

[63] Continuation of Ser. No. 35,347, May 2, 1979, abandoned.

[51] Int. Cl.³ .............................................. H02H 3/20
[52] U.S. Cl. ...................................... 361/91; 361/56; 361/111; 357/51; 330/298; 330/207 P
[58] Field of Search ................... 361/91, 56, 111, 110, 361/88; 330/207 P, 298; 307/303; 357/46, 51

[56] References Cited

U.S. PATENT DOCUMENTS

| | | | |
|---|---|---|---|
| 2,860,196 | 11/1958 | Schultz | 330/298 |
| 3,390,346 | 6/1968 | Wheatley, Jr. | 330/298 X |
| 3,484,708 | 12/1969 | Illingworth | 330/298 |
| 4,158,178 | 6/1979 | Schade, Jr. | 361/91 X |
| 4,178,619 | 12/1979 | Seiler et al. | |
| 4,186,418 | 1/1980 | Seiler | |

OTHER PUBLICATIONS

Pp. 374-377 of the 1978 RCA Linear Integrated Circuits Handbook.

*Primary Examiner*—Patrick R. Salce
*Attorney, Agent, or Firm*—Paul J. Rasmussen; William H. Meagher; W. Brinton Yorks, Jr.

[57] ABSTRACT

A power output circuit is provided which is protected against latching due to voltage pulses developed by an inductive load. The circuit comprises a transistor constructed on a monolithic integrated circuit chip including a grounded semiconductor substrate of one type conductivity, and including collector and emitter regions of opposite type conductivity located on the substrate and containing opposite type conductivity modifiers. The collector and emitter regions are separated by a base region of one type conductivity, and the collector region is coupled to the inductive load. A fourth region of one type conductivity, containing one type conductivity modifiers is located on the substrate in galvanic contact with the collector region. A resistive impedance is coupled between the fourth region and a source of reference potential, and a capacitor is coupled between the fourth region and the source of reference potential. The capacitor and the resistive impedance bias the fourth localized region above ground potential so that the current created by an inductively developed voltage pulse from the load will be conducted to the substrate by the diode junction formed by the collector of the transistor and the fourth localized region under these conditions. Latching of the power amplifier or supply circuitry is thereby prevented.

11 Claims, 5 Drawing Figures

ANTI-LATCH CIRCUIT FOR POWER OUTPUT DEVICES USING INDUCTIVE LOADS

This is a continuation, of application Ser. No. 035,347, filed May 2, 1979; now abandoned.

This invention relates to power output devices using inductive loads, and in particular, to a circuit for protecting a power amplifier against latching due to inductively developed voltage pulses.

Power output transistors, such as those used in audio amplifiers and switched power supplies, frequently drive inductive loads, such as relays, transformers, or audio loudspeaker coils. Power transistors with inductive loads will generally perform in an acceptable manner when operating linearly. Under linear operating conditions, the transistors continuously behave as low impedance voltage sources for the loads, which provides adequate damping for inductively developed voltage spikes which may occasionally be coupled back to the transistors from the loads. However, when the power output transistors in a switched power supply are momentarily switched to a low (off) state by the driving signal, or the transistors in an audio amplifier are driven nonlinearly by a large input signal, the transistors will present a high impedance to the inductive loads. The inductive energy in the loads will build to a peak value and then will surge back into the amplifier or power supply. This large surge of energy can appear as a large negative voltage pulse, which can create regenerative current loops in one or more of the power output transistors and other circuitry in the amplifier or power supply. The current loops can "latch" the circuits in the amplifier or power supply, a condition in which the output of the circuits is reduced to a fraction of the normal maximum output level. The latching condition will persist until power is removed from the latched circuitry.

This problem of latching is even more acute when the power output transistors are not discrete devices, but are integrated as part of a monolithic integrated circuit chip, such as the RCA CA3134 or the TDA1190 TV Sound I.F. and Audio Output Subsystems integrated circuits. In this case, the large negative voltage pulses will not only latch one or more of the power output transistors, but the currents developed by the pulses can be conducted to other areas of the I.C. chip, where other circuit functions can be adversely affected. Moreover, the resultant high current densities on the small I.C. chip can cause one or more of the transistors on the chip to be destroyed, and can also melt the metallic conductors formed on the surface of the chip.

In accordance with the principles of the present invention, a circuit is provided which prevents latching in a power amplifier or supply. A power output transistor is formed on a monolithic integrated circuit chip, including a semiconductor substrate of one type conductivity and an epitaxial layer of opposite type conductivity with an interface therebetween. A first localized region of opposite type conductivity is located in the substrate adjacent to the interface. A second localized region of one type conductivity is located in the epitaxial layer adjacent to the surface of the layer, and a third localized region of opposite type conductivity is located in the second localized region adjacent to the surface. A fourth localized region of one type conductivity is located in the epitaxial layer adjacent to the surface.

The epitaxial layer and the first localized region comprise the collector of the power output transistor, and the second and third regions comprise the base and emitter of the transistor, respectively. An inductive load is located external to the integrated circuit chip, and is coupled between the collector and a source of reference potential. A capacitor and a resistive impedance are also located external to the integrated circuit chip, and are coupled in parallel between the fourth localized region and the source of reference potential.

The capacitor and the resistive impedance bias the fourth localized region above ground potential so that the current created by an inductively developed voltage pulse from the load will be conducted to the substrate by the diode junction formed by the collector of the transistor and the fourth localized region under these conditions. Latching of the power amplifier or supply circuitry is thereby prevented.

Figure 1:
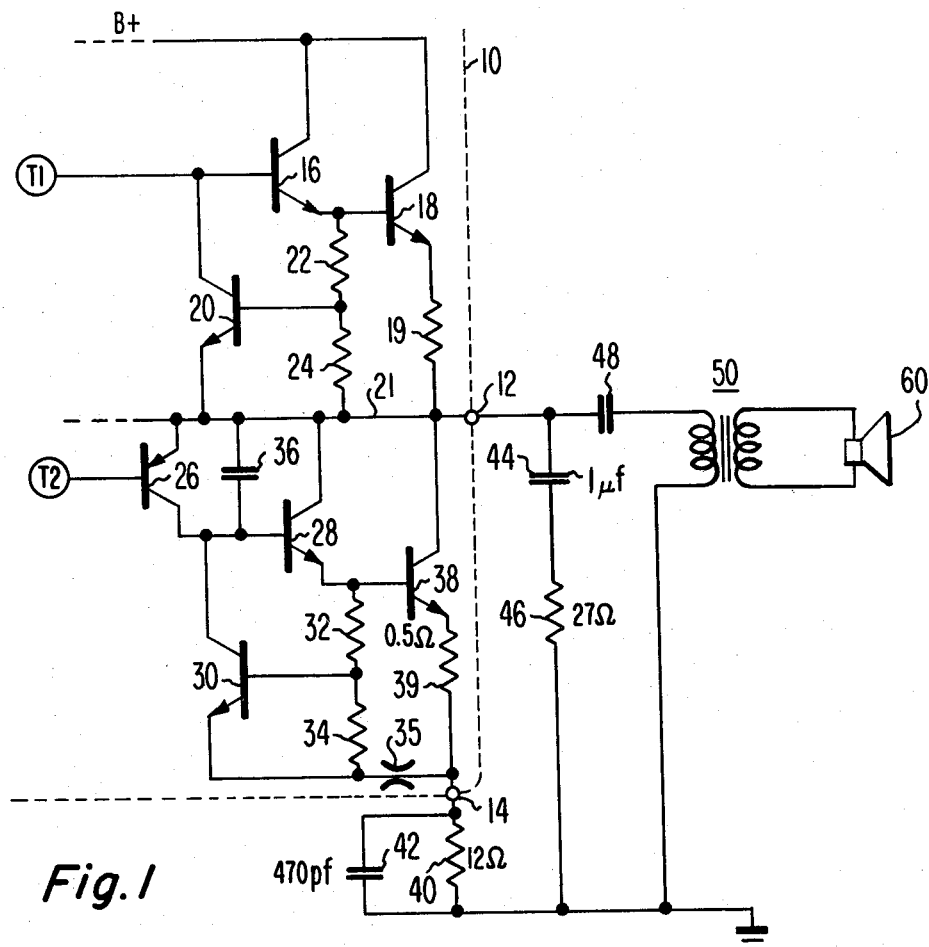
FIG. 1 illustrates in schematic diagram form, an audio amplifier constructed in accordance with the principles of the present invention.

Referring to FIG. 1, the power output section of an audio monolithic integrated circuit chip 10 is shown connected to a loudspeaker 60. A dashed box 10 represents the boundary of the integrated circuit chip. Connections to the chip from external components are made at output terminals 12 and 14. The power output section of the I.C. chip is driven by signals of mutually opposite polarity applied from other portions of the chip at internal chip connections T1 and T2. The signal applied at connection T1 is coupled to the base of an emitter follower coupled transistor 16. The collector of transistor 16 is coupled to a source of supply voltage (B+) and its emitter is coupled to the base of a power output transistor 18. The collector of output transistor 18 is coupled to the B+ supply, and its emitter is coupled to the audio output terminal 12 by a resistor 19. Transistors 16 and 18 are D.C. biased by resistors 22 and 24, and a transistor 20. Resistors 22 and 24 are serially coupled from the emitter of transistor 16 to a conductor 21, which is connected to the audio output terminal 12. Transistor 20 has a collector coupled to the base of transistor 16, a base coupled to the junction of resistors 22 and 24, and an emitter coupled to conductor 21. Transistor 20 and resistors 22 and 24 operate as a $V_{be}$ biasing circuit to maintain the bias voltage on transistors 16 and 18 through negative feedback in the presence of temperature and supply voltage variations in the I.C. chip.

The signal applied at connection T2 is coupled to the base of a transistor 26, which has its emitter coupled to conductor 21 and its collector coupled to the base of an emitter follower coupled transistor 28. The collector of transistor 28 is coupled to conductor 21, and its emitter is coupled to the base of a power output transistor 38. A capacitor 36 is coupled from the collector to the emitter of transistor 26. Power output transistor 38 has its collector coupled to the audio output terminal 12, and its emitter is coupled to an output terminal 14 by a resistor 39. D.C. biasing for transistors 28 and 38 is provided by a second $V_{be}$ biasing circuit including resistors 32 and 34 and a transistor 30. Resistors 32 and 34 are serially connected between the emitter of transistor 28 and output terminal 14. The collector of transistor 30 is coupled to the base of transistor 28, its base is coupled to the junction of resistors 32 and 34, and its emitter is coupled to output terminal 14. The second $V_{be}$ biasing circuit operates in a manner similar to the $V_{be}$ biasing circuit described previously.

Discrete circuit components are located external to I.C. chip 10 and are connected to the chip at terminals 12 and 14. A coupling capacitor 48 supplies output signals from audio output terminal 12 to the primary winding of an output transformer 50. The other end of the primary winding of transformer 50 is coupled to ground. The secondary winding of transformer 50 is coupled to the coil of a loudspeaker 60. A filter circuit comprising the serial combination of a capacitor 44 and a resistor 46 is coupled from output terminal 12 to ground. This filter circuit acts as a low pass filter to remove high frequency noise signals at the audio output terminal.

In accordance with the present invention, a resistor 40 and a capacitor 42 are coupled in parallel between output terminal 14 and ground. The resistor 40 biases the emitter of transistor 38 at a voltage level which is slightly above ground potential, which prevents the transistor from latching when negative voltage pulses are coupled to the collector of the transistor from transformer 50. The capacitor 42 performs two functions in the circuit. First, the capacitor 42 stores energy, which maintains the positive bias at terminal 14 during those times that negative pulses are being applied to the circuit from the transformer 50. Second, the capacitor 42 bypasses A.C. signals at terminal 14 to ground, which prevents degenerative reduction in the gain of transistor 38. Although the potential at terminal 14 is developed by the voltage drop across resistor 40 in the example shown in FIG. 1, any element which biases terminal 14 above ground may be used in an embodiment of this invention. For instance, a diode may be used in place of resistor 40 if desired.

Figure 2:
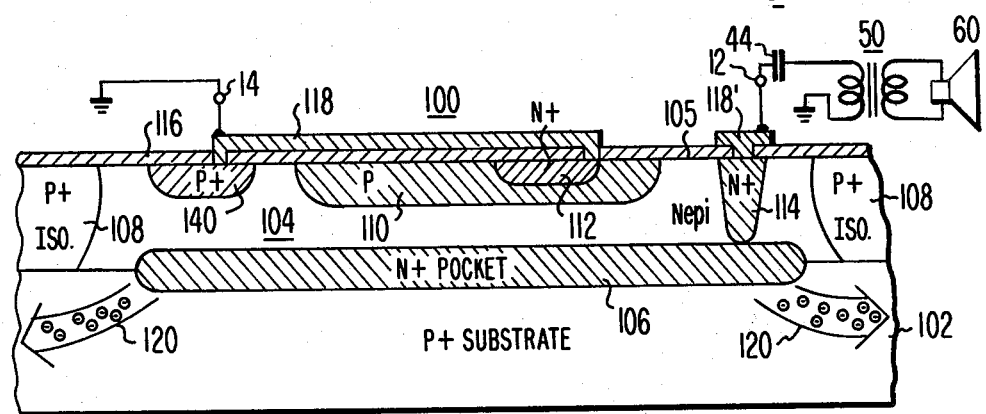
FIG. 2 illustrates a cross-sectional view of an integrated circuit power output transistor schematically connected in a prior art circuit.
Figure 3:
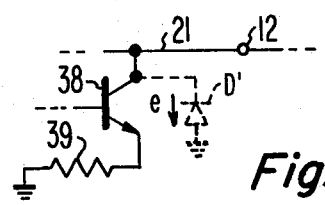
FIG. 3 is a schematic drawing of the circuit shown in FIG. 2.

Exactly how the capacitor 42 and the resistor 40 operate to prevent latching of transistor 38 may be understood by referring to FIGS. 2 through 5, which show cross-sectional and schematic representations of transistor 38 and associated circuitry. FIG. 2 is a cross-sectional representation of power output transistor 38 as it is constructed in the RCA CA3134 TV Sound I.F. and Audio Output Subsystems integrated circuit chip. The audio output section of this integrated circuit is shown as the integrated circuit portion 10 of FIG. 1, and is illustrative of a group of integrated circuit chips, including the RCA CA1190GQ and the TDA1190 integrated circuits, which are designed to drive a loudspeaker (or its coupling transformer) directly at high power levels (i.e., 3 watts) without the need for additional power output transistors.

The integrated circuit 100 of FIG. 2 includes a body of semiconductor material, usually silicon, which comprises a substrate 102 of one type conductivity and a lightly doped epitaxial layer 104 of opposite type conductivity. In usual practice, and in this example, the substrate 102 is of P+ type conductivity and the epitaxial layer 104 is of N type conductivity.

The epitaxial layer 104 is divided into separate islands, or "boats" similar to the one shown in FIG. 2 by conventional P+ type isolation regions 108. These regions provide electrical separation between the epitaxial boats on the integrated circuit chip, each of which contains one or more cooperative circuit elements. At the interface between the P+ substrate 102 and the epitaxial layer 104 is a localized region or buried pocket 106 of high carrier density N+ type material. A localized diffusion region 114, also of high carrier density N+ type material, forms a low conductivity path between the surface 105 of the epitaxial layer 104 and the buried pocket 106.

Adjacent to the surface 105 of the epitaxial layer 104 is a diffused region 110 of P type material. Also adjacent to the surface 105 is a diffused region 112 of high carrier density N+ type material, which is contained within the P type region 110. A diffused region 140 of high carrier density P+ type material is also located in the epitaxial layer 104 adjacent to the surface 105, and is situated intermediate the P type region 110 and one of the isolation regions 108. Overlaying the surface 105 of the integrated circuit chip is an insulating layer 116 of silicon dioxide. Connections to external circuit elements are made through openings in the insulating layer 116 by metallized conductors 118 and 118', which make contact with the diffused regions at the surface 105 of the chip. Metallized conductor 118 connects the P+ type region 140 and the N+ type region 112 to output terminal 14, and metallized conductor 118' connects the N+ type region 114 to output terminal 12.

The semiconductor regions shown in FIG. 2 cooperate to form the power output transistor 38 of FIG. 1. Specifically, the N+ region 114, the N+ pocket 106, and the epitaxial layer 104 comprise the collector of transistor 38. The high carrier density of the N+ region 114 and the N+ pocket 106 ensure that the transistor will have a low dynamic collector resistance. The P type region 110 comprises the base of transistor 38, and the N+ type region 112 comprises the emitter of the transistor. The body of the N+ type region 112 also forms the emitter resistor 39 of the transistor, in what is known as a "bulk" resistor.

In FIG. 1, it may be seen that resistor 39 is coupled to resistor 34 and the emitter of transistor 30. On the integrated circuit chip 100 of the CA3134, this connection is not made by a metallized conductor on the surface of the chip, but is made by a "tunnel" 35, which is shown as the P+ type region 140 in FIG. 2. The complexity of the metallized conductors on the surface of the CA3134 integrated circuit chip necessitates the use of this tunnel connection in this instance.

In FIG. 2, transistor 38 is coupled in a prior art configuration with external circuit connections made as shown in FIG. 2 of the CA3134E Preliminary Data, shown on page 368 of the 1977 RCA Linear Integrated Circuits Databook, published by the RCA Solid State Division, Somerville, N.J. In this configuration, the collector of transistor 38 is coupled to an inductive load (transformer 50 and loudspeaker 60) by way of output terminal 12 and coupling capacitor 44. The other output terminal 14 is coupled to ground. When so connected, transistor 38 is capable of latching under large signal conditions which cause the transistor to operate nonlinearly. Transformer 50 can develop a large negative voltage pulse under these conditions, which will surge back to the collector of transistor 38 through terminal 12. The negative voltage pulse will reach the buried pocket 106, driving it toward and below ground potential (zero volts). When the buried pocket 106 reaches a potential of approximately minus 0.5 volts, the N+ pocket will form two diodes with the P+ tunnel 140 and the P+ substrate 102, respectively, which are both at ground potential. These diodes will begin to conduct at this time, but since the diode formed by the P+ tunnel 140 and the N+ pocket 106 contains an intermediate resistance comprising the N type material of the epitaxial layer 104, virtually all of the current developed by the negative voltage pulse will surge through the diode junction formed by the N+ pocket 106 and the P+ substrate 102, as shown by diode D' in FIG. 3. This current, which has a magnitude on the order of 500 milliamps to one ampere, will be injected into the P+ substrate 102 as negatively charged minority carriers, as shown by arrows 120 in FIG. 2 and arrow e in FIG. 3. The current flow will reduce the output of the transistor 38 to a fraction of its previous level. Since the minority carriers are negatively charged, they will seek a path to a positive potential, which in this case is the B+ supply. The minority carriers will thus flow through the substrate 102 to other areas of the integrated circuit 100 (not shown), where they can cause latching in the I.F. amplifiers and the FM detector on the chip, thereby disabling these circuits also. Large current surges of this type have been known to destroy transistor 38 and melt the metallized B+ conductor under the most adverse latching conditions.

Figure 4:
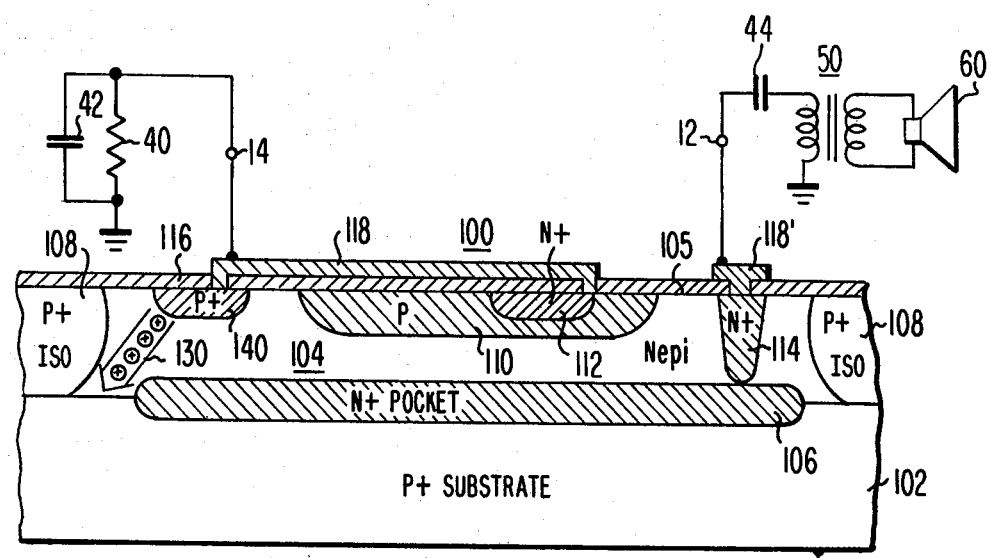
FIG. 4 illustrates a cross-sectional view of an integrated circuit power output transistor schematically connected to an inductive load in accordance with the principles of the present invention.
Figure 5:
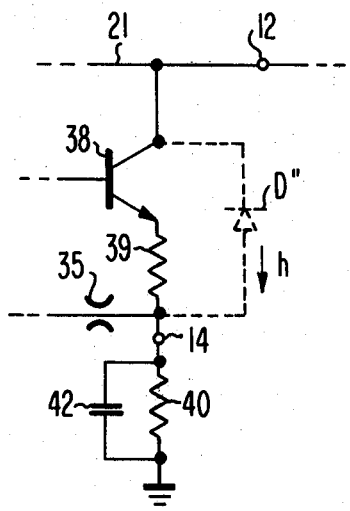
FIG. 5 illustrates in schematic diagram form the circuit shown in FIG. 4.

The latching problem of the prior art configuration of FIG. 2 is prevented by the arrangement in accordance with the present invention, shown in FIGS. 4 and 5. The arrangement shown in FIGS. 4 and 5 is identical to those of FIGS. 2 and 3, respectively, except that output terminal 14 is coupled to ground by the parallel combination of capacitor 42 and resistor 40. Under low or normal output signal levels, only a small amount of current flows through the collector-to-emitter path of transistor 38 and thence to ground by way of resistor 40. The voltage drop across resistor 40 is thus very small, and the D.C. potential at terminal 14 is only a few tenths of a volt above ground potential. Terminal 14 is bypassed to ground for A.C. signals by the bypass capacitor 42, thereby maintaining the normally high gain of transistor 38.

When the signal levels provided at connections T1 and T2 of the CA3134 integrated circuit are increased, as would occur when the volume of the television receiver is increased, transistor 38 is increasingly driven toward a nonlinear operating condition. Transistor 38 will conduct an increasing amount of current through its collector-to-emitter path and thence to ground through resistor 40. The voltage drop across resistor 40 will thus increase, and the resultant higher voltage level at terminal 14 will be sustained as capacitor 42 is charged. Under strong signal conditions, the voltage at terminal 14 can approach one volt.

Finally, the power output section of the CA3134 integrated circuit can be driven hard enough so that the power output transistor 38 will begin to operate nonlinearly as the output signal is clipped at its maximum and minimum excursions. The nonlinear operation can cause transformer 50 to couple its inductively developed energy back into the collector of transistor 38 as negatively directed voltage pulses. As before, these voltage pulses will reach the buried N+ pocket 106 of the collector. The collector voltage of transistor 38 will thus begin to fall rapidly, including the N+ type region 114 and the epitaxial layer 104. As the collector voltage of the transistor drops to approximately plus 0.5 to plus 0.3 volts, it will be low enough to cause the diode junction formed by the N+ pocket 106 and the epitaxial layer 104, and the P+ tunnel 140, to begin to conduct, since the P+ tunnel 140 is at a voltage level of approximately one volt due to capacitor 42 and resistor 40. This diode junction is represented as diode D" in FIG. 5. As the diode D" begins to conduct the surge of current resulting from the negatively directed voltage pulses, its one volt potential is maintained by the charge stored by capacitor 42. The P+ tunnel 140 reacts to this current surge by injecting a flow of positively charged minority carriers (holes) into the surrounding epitaxial layer 104. Since these minority carriers are positively charged, they will flow to a lower potential, which in this case is the nearby grounded substrate 102. This minority carrier flow is represented by arrow 130 in FIG. 4 and by arrow h in FIG. 5. Once the minority carriers reach the substrate, they harmlessly dissipate as ground current, and flow to the integrated circuit power supply. The diode D" thus prevents latching of transistor 38 or other circuitry in the integrated circuit chip.

In FIGS. 4 and 5, the anode of the diode D" is formed by the P+ tunnel 140. However, the anode of diode D" can also be formed by any other region of P+ type material which is in contact with the epitaxial layer 104 and the output terminal 14. For instance, if the collector or emitter of a PNP transistor or the anode of a diode is connected to output terminal 14, that electrode could also comprise a P+ type region which is in contact with the epitaxial layer 104 so as to form the anode of the diode D". In the CA3134, the epitaxial layer boat 104 is a large area which is in contact with all of the circuit components of FIG. 1 which are connected to conductor 21, which includes three resistors, a capacitor, and four transistors (not all here shown). Thus, it is quite likely that a P+ type region will be readily available at the collector of an integrated circuit power output transistor which can become the anode of diode D", as shown herein.

It also may be appreciated that the transformer 50 may be omitted from the loudspeaker circuit, with the power output device directly coupled to the loudspeaker winding, as shown in the aforementioned FIG. 2 on page 368 of the 1977 RCA Linear Integrated Circuits Databook. In this case, the induced negatively directed voltage pulses will originate from the loudspeaker winding and be coupled directly back to the power output device.

What is claimed is:

1. A power output circuit which is prevented from latching due to voltage pulses developed by an inductive load comprising:
a monolithic integrated circuit chip including a semiconductor substrate of one type conductivity and an epitaxial layer of opposite type conductivity with an interface therebetween, said epitaxial layer having a substantially planar surface, a first localized region of opposite type conductivity located in said substrate adjacent to said interface and containing opposite type conductivity modifiers, a second localized region of said one type conductivity located in said epitaxial layer adjacent to said surface, a third localized region of said opposite type conductivity located in said second localized region adjacent to said surface and containing opposite type conductivity modifiers, and a fourth localized region of said one type conductivity located in said epitaxial layer adjacent to said surface and containing one type conductivity modifiers, wherein said epitaxial layer and said first localized region comprise the collector of a transistor and said second and third regions comprise the base and emitter of said transistor, and wherein said fourth localized region comprises means for conductively coupling said emitter of said transistor to other elements of said power output circuit located on said monolithic integrated circuit chip during normal operating conditions;

an inductive load, located external to said integrated circuit chip, and coupled between said collector and said substrate; and means for offsetting the potential of said fourth region relative to the potential of said substrate in such a direction that a protection diode formed between said collector and said fourth region becomes conductive in response to voltage pulses developed by said load prior to conduction by a diode formed by said collector and said substrate, said voltage pulses having a polarity tending to forward bias both of said diodes, wherein said offsetting means comprises the parallel combination of a capacitor and a resistive impedance, located external to said integrated circuit chip, and coupled between said fourth localized region and said substrate.

2. A power output circuit which is protected against latching due to voltage pulses developed by an inductive load comprising:

a transistor, constructed on a monolithic integrated circuit chip including a grounded semiconductor substrate of one type conductivity, and including collector and emitter regions of opposite type conductivity located on said substrate and containing opposite type conductivity modifiers, said collector and emitter regions being separated by a base region of said one type conductivity, said collector region being coupled to said inductive load;

a fourth region of said one type conductivity containing one type conductivity modifiers, located on said substrate in galvanic contact with said collector region and functioning under normal operating conditions to conductively couple said emitter region of said transistor to other elements of said power output circuit located on said monolithic integrated circuit chip; and means for offsetting the potential of said fourth region relative to the potential of said substrate in such a direction that, when voltage pulses developed by said load occur with a polarity tending to forward bias a diode formed between said collector and said substrate, conduction by said collector-substrate diode is delayed relative to conduction by a protection diode formed between said collector and said fourth region;

wherein said offsetting means comprises a resistive impedance coupled between said fourth region and ground; and a capacitor coupled between said fourth region and ground.

3. The power output circuit of claim 1, wherein said monolithic integrated circuit chip further comprises a fifth localized region of opposite type conductivity located in said epitaxial layer and containing opposite type conductivity modifiers, for connecting said first localized region to said surface.

4. The power output circuit of claims, 1, 2 or 3, wherein said one type conductivity is P type conductivity, said opposite type conductivity is N type conductivity, said opposite type conductivity modifiers are N+ type conductivity modifiers, and said one type conductivity modifiers are P+ type conductivity modifiers.

5. The power output circuit of claims 1 or 2, wherein the emitter region of said transistor is coupled to said fourth region by a metallized conductor.

6. The power output circuit of claim 3, wherein said monolithic integrated circuit chip further comprises a first metallized conductor located at said surface and contacting said fifth localized region, and a second metallized conductor located at said surface and contacting said third and fourth localized regions, said first and second metallized conductors comprising output terminals of said integrated circuit chip.

7. The power output circuit of claim 6, wherein said third region further comprises an emitter resistance of said transistor.

8. The power output circuit of claims 1 or 2, wherein said resistive impedance comprises a resistor.

9. The power output circuit of claims 1 or 2, wherein said resistive impedance comprises a diode.

10. The power output circuit of claims 1 or 2, wherein said inductive load comprises a transformer winding.

11. The power output circuit of claims 1 or 2, wherein said inductive load comprises a loudspeaker coil winding.

* * * * *